United States Patent [19]

Tabara

[11] Patent Number: 5,686,363

[45] Date of Patent: Nov. 11, 1997

[54] CONTROLLED TAPER ETCHING

[75] Inventor: Suguru Tabara, Hamamatsu, Japan

[73] Assignee: Yamaha Corporation, Japan

[21] Appl. No.: 163,474

[22] Filed: Dec. 6, 1993

[30] Foreign Application Priority Data

Dec. 5, 1992 [JP] Japan ..................... 4-350848

[51] Int. Cl.$^6$ ............................................. H01L 21/469
[52] U.S. Cl. ..................... 437/233; 437/225; 437/947; 437/981; 148/DIG. 161; 156/662.1
[58] Field of Search ............ 156/662.1; 437/233, 437/947, 981, 225; 148/DIG. 42, DIG. 161

[56] References Cited

U.S. PATENT DOCUMENTS

| 4,310,380 | 1/1982 | Flamm et al. | 156/662.1 |
| 4,364,793 | 12/1982 | Graves | 156/643.1 |
| 4,663,643 | 5/1987 | Mimura | 357/22 |
| 4,855,017 | 8/1989 | Douglas | 156/662.1 |
| 4,873,176 | 10/1989 | Fisher | 156/643.1 |
| 4,943,344 | 7/1990 | Tachi et al. | 156/662.1 |
| 4,986,877 | 1/1991 | Tachi et al. | 156/662.1 |
| 5,211,790 | 5/1993 | Tatsumi | 156/662.1 |
| 5,217,570 | 6/1993 | Kadomura | 156/665 |
| 5,242,536 | 9/1993 | Schoenborn | 156/662.1 |
| 5,258,219 | 11/1993 | Iwamatsu | 428/209 |
| 5,310,456 | 5/1994 | Kadomura | 156/662.1 |

FOREIGN PATENT DOCUMENTS

| 56-1538 | 1/1981 | Japan . |
| 56-23752 | 3/1981 | Japan . |
| 62106629 | 3/1981 | Japan . |
| 0217633 | 10/1985 | Japan . |
| 1-239932 | 9/1989 | Japan . |
| 1-291428 | 11/1989 | Japan . |
| 0159127 | 7/1991 | Japan . |
| 0199824 | 7/1992 | Japan . |
| 5-226304 | 9/1993 | Japan . |
| 0177086 | 6/1994 | Japan . |

OTHER PUBLICATIONS

S. Wolf, et al., *Silicon Processing For The VLSI Era*, vol. 1: Process Technology, pp. 551–565, Lattice Press.

T. Ohiwa, et al., *SiO$_2$ Tapered Etching Employing Magnetron Discharge*, 1990 Dry Process Symposium, V-3, pp. 105–109.

M. Sato, et al., *Al–Cu Alloy Etching Using Aluminum Chloride Source*, 1992 Dry Process Symposium, II-3, pp. 59–63.

Semiconductor Dry Etching Technology, pp. 111–112, 1992. (In Japanese).

R.A. Powell, Materials Processing Theory and Practices, vol. 4, pp. 10–11, 14–33.

Horiike, et al., Proceedings of 12th Symposium on Dry Process, pp. 21–30, 1979.

*Primary Examiner*—Trung Dang
*Attorney, Agent, or Firm*—Ostrolenk, Faber, Gerb & Soffen, LLP

[57] ABSTRACT

After a polycrystalline Si layer is deposited on an insulating film covering the surface of a semiconductor substrate, a mask layer having a desired pattern is deposited on the polycrystalline Si layer. Using the mask layer as an etching mask, the polycrystalline Si layer is dry-etched by a plasma etching process. In the plasma etching process, a metal halide (such as AlCl$_3$ and AlBr$_3$) gas is introduced in an etching reaction chamber, or Al halide is generated by reacting halogen (Cl, Br or the like) contained in an etching gas with Al constituting the inner wall of the etching reaction chamber or an electrode. The etching process is performed while attaching an Al halide film to the etched side walls of the polycrystalline film. The polycrystalline Si film is etched in a taper shape becoming thicker at the lower portion. The Al halide can be removed easily.

20 Claims, 10 Drawing Sheets

FIG.2
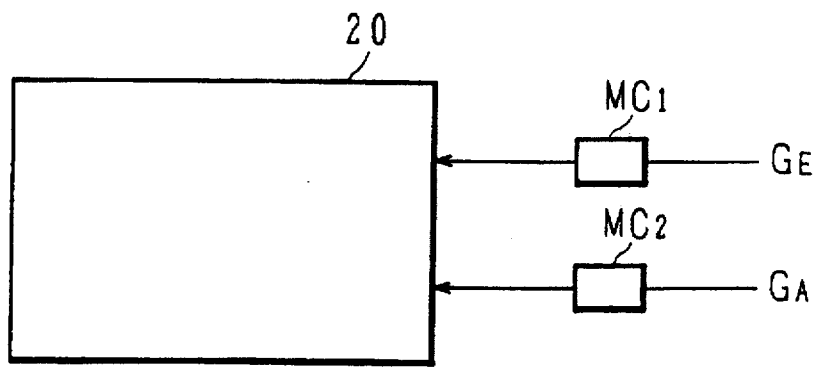
FIG.3A FIG.3B FIG.3C
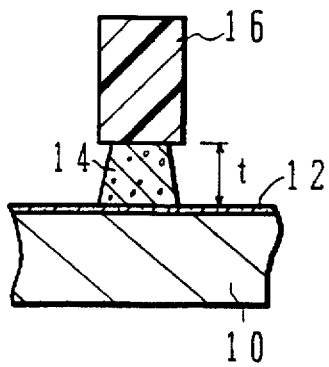 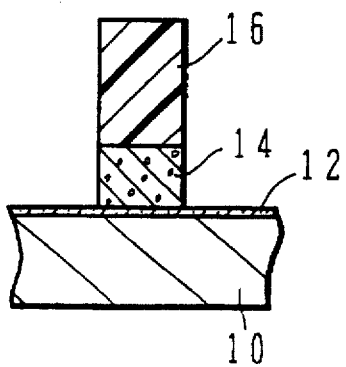 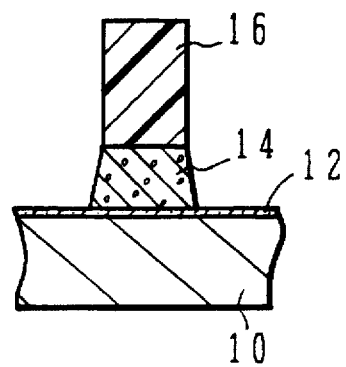

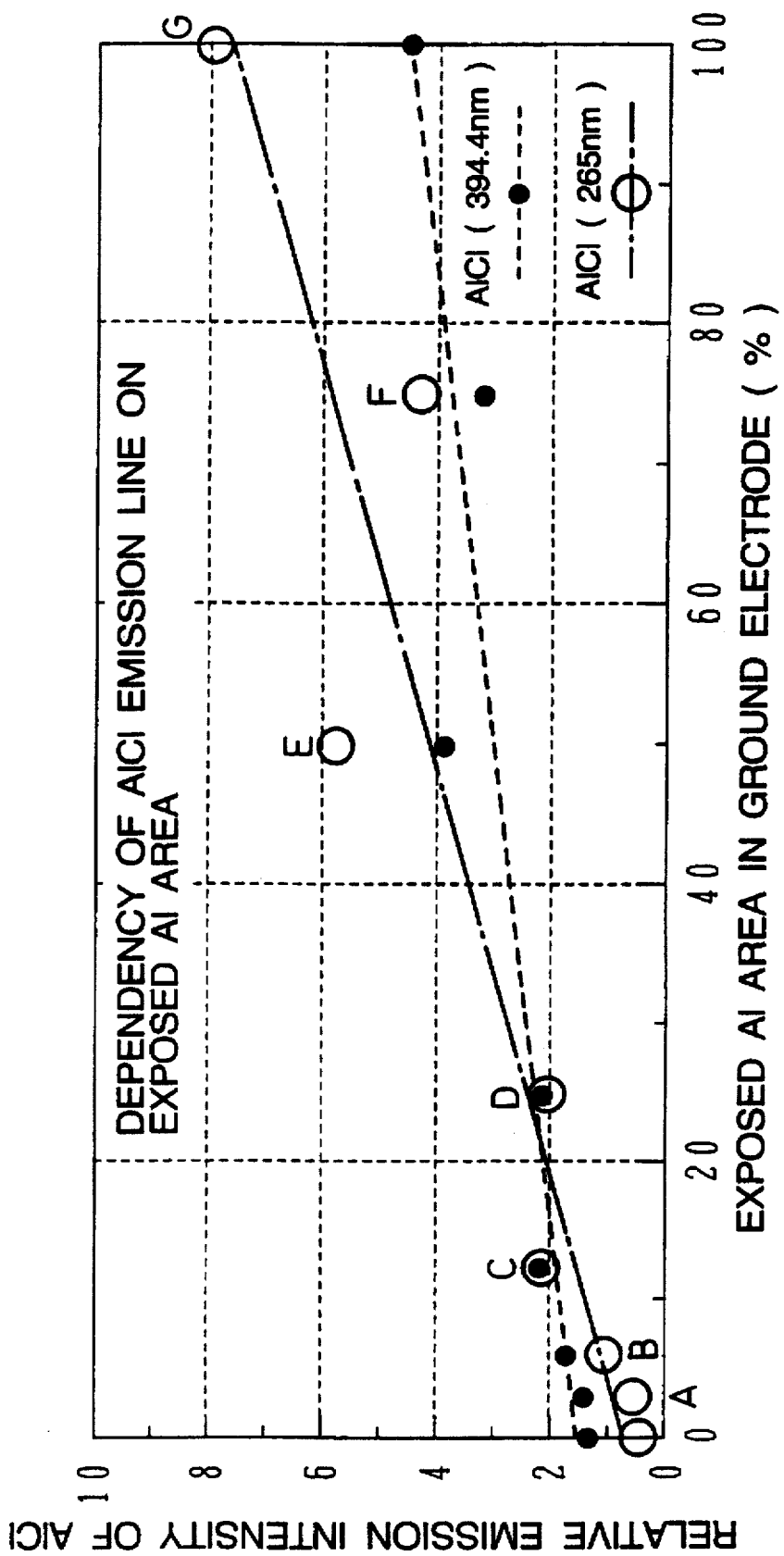

CONTROLLED TAPER ETCHING

BACKGROUND OF THE INVENTION

The present invention relates generally to dry etching for selectively etching a silicon-based material (such as monocrystalline Si, polycrystalline Si, refractory metal silicide) by a plasma etching process, and particularly to dry etching providing a high yield of taper etching.

As a method of taper-etching an Si-based material by a plasma etching process, there are known (a) a method using a mixed gas of $SF_6+C_2Cl_2F_4$ (for example, refer to Japanese Patent Laid-open Publication No. 1-291428), (b) a method using a mixed gas of $C_2+N_2$ (for example, refer to Japanese Patent Laid-open Publication No. 1-239932), (c) a method using a mixed gas of $SiCl_3+O_2$ or a mixed gas of $Cl_2+SiCl_4+O_2$, and other methods.

With the method (a), a gas ($C_2Cl_2F_4$) contributing to deposition is added to an etching gas ($SF_6$) so that a deposition film is formed on the side walls of the etched Si layer and protects the side walls, allowing the Si layer to be taper-etched.

With the method (a), however, the deposition film is attached also to the inner wall of the etching reaction chamber. The attached film may be stripped off from the wall and become particles which lower the manufacturing yield.

With the method (b), in plasma-etching a laminated layer (polycide layer) of a polycrystalline Si layer and a silicide layer by using a resist mask, precipitate is formed on the side walls of the silicide layer and resist mask. This precipitate functions to substantially thicken the resist pattern so that the polycide layer is taper-etched, becoming thicker at the lower portion.

With the method (b), however, explosive $NCl_3$ is formed as by-product, leaving a risk of explosion.

With the method (c), use of a mixed gas of $SiCl_4+O_2$ generates silico-oxalic acid $Si_2Cl_4(OOH)_2$ as by-product. Silico-oxalic acid is explosive in the presence of water contents, leaving a risk of explosion. $SiO_xCl_y$ and $SiO_x$ cannot be removed by the ordinary ashing process so that a cleaning process (HF process) is additionally required. Adding the HF process not only increases the number of processes, but also lowers the manufacturing yield. For example, in a gate electrode patterning process for a MOS type LSI, if an HF process is performed after etching a gate electrode material layer, the $SiO_2$ film as the gate insulating film is etched by HF, resulting in a defective device.

Use of a mixed gas of $Cl_2+SiCl_4+O_2$ also requires the HF process to remove $SiO_xCl_y$, posing the problems of an increased number of processes and a lowered manufacturing yield.

SUMMARY OF THE INVENTION

It is an object of the present invention to provide a novel dry etching method and apparatus capable of taper-etching an Si-based material without the above-described risk and disadvantages.

According to one aspect of the present invention, there is provided a dry etching method for selectively etching a silicon-based material layer by a plasma etching process using an etchant gas containing halogen, such as Cl or Br, wherein the plasma etching process etches the silicon-based material layer by supplying metal halide, such as Al halide to the plasma and attaching Al halide to the side walls of the silicon-based material layer.

Al halide such as $AlCl_3$ and $AlBr_3$ attached to the side walls of an Si-based material layer during the plasma etching process protects the side walls. Therefore, the Si-based material layer is etched in a taper shape, becoming thicker at the lower portion.

$AlCl_3$ evaporates when heated to about 180° C. or higher. Therefore, $AlCl_3$ attached, for example, to the inner wall of the etching reaction chamber can be easily removed. Furthermore, $AlCl_3$ dissolves in water so That $AlCl_3$ attached to the surface of the processed wafer can be removed by a normal resist removal method (such as cleaning with $H_2SO_4$ and $H_2O_2$).

According to another aspect of the present invention, taper-etching may also be realized easily by providing an Al member in a dry etching apparatus without using any means for externally supplying Al halide gas to the apparatus.

As described above, Al halide such as $AlCl_3$ and $AlBr_3$ is used as a side wall protective material for the taper-etching of an Si-based material layer. It is therefore possible to perform taper-etching without any risk of explosion. Further, Al halide attached to the inner surface of an etching reaction chamber and to the surface of a wafer can be easily removed, improving the manufacturing yield more than a conventional method.

A dry etching apparatus simple in structure and easy to use can be realized by supplying plasma with Al halide generated by the reaction between an etching gas and Al constituting the inner wall of the etching reaction chamber or an electrode.

BRIEF DESCRIPTION OF THE DRAWINGS

FIG. 2 is a block diagram explaining a manner to introduce Al into plasma.

FIG. 3A to 3C are cross sectional views of substrates illustrating how the shape of an etched polycrystalline Si layer changes with the amount of Al introduced into plasma.

FIG. 7A to 7D are plots of taper angles of polycrystalline silicon layer after etching is completed.

DETAILED DESCRIPTION OF THE PREFERRED EMBODIMENTS

With reference to accompanied drawings, an embodiment of the present invention will be explained below.

For the purpose of the present disclosure, etch is considered to be "taper etch" if no peripheral location of a profile of a resulting conductive wiring layer such as polycrystalline silicon under the mask has encroachment from a mask edge at the interface between the mask and polycrystalline silicon when the etching is completed. Thus, "taper etch" includes anisotropic vertical etching.

FIG. 1A to 1D illustrate a dry etching method according to an embodiment of the invention.

Figure 1A:
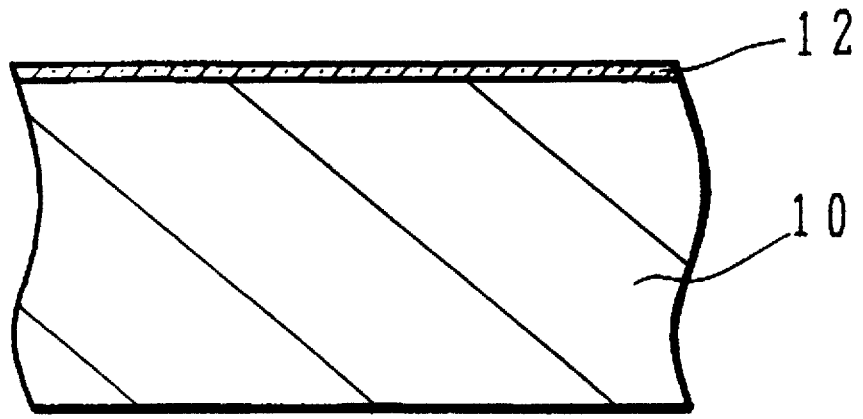
FIG. 1A to 1D are cross sectional views of a substrate explaining the dry etching method according to an embodiment of the present invention.
Figure 1B:
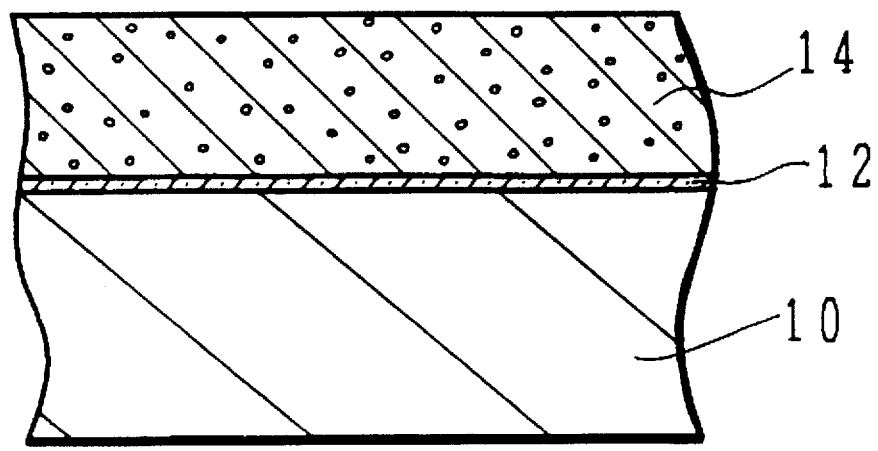
Figure 1C:
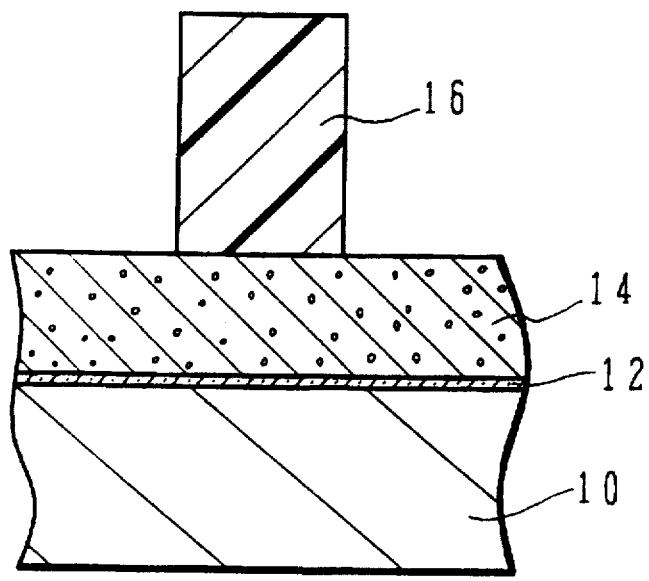
Figure 1D:
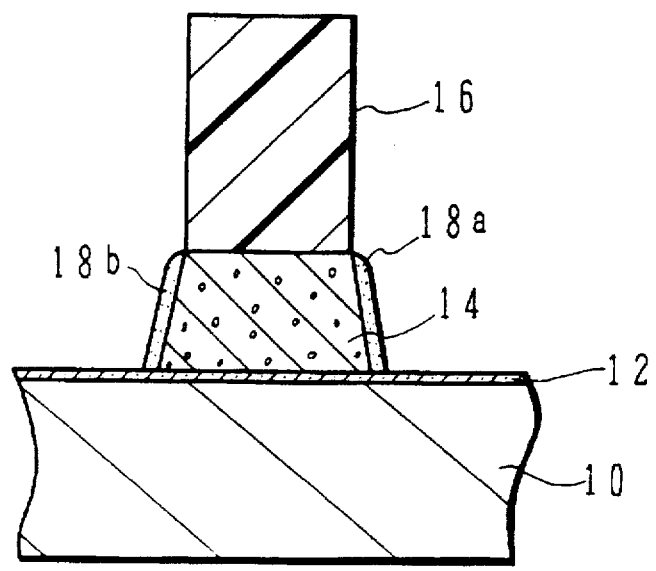

First, a thin insulating film 12 such as $SiO_2$ is formed on the surface of a semiconductor substrate 10 such as Si (FIG. 1A). After the deposition, a polycrystalline Si layer 14 is deposited on the insulating film 12 (FIG. 1B). A resist layer 16 having a desired electrode or wiring pattern is deposited on the polycrystalline Si layer 14 (FIG. 1C). Using the resist layer 16 as an etching mask, the polycrystalline Si layer 14 is dry-etched by a plasma etching process. Alternatively, silicon nitride and silicon oxide may be used as an etching mask.

During the plasma etching process, Al is introduced into the plasma containing Cl or Br to generate Al halide such as aluminum trichloride and aluminum tribromide ($AlCl_3$ and $AlBr_3$). The vapor pressure of $AlCl_3$ or $AlBr_3$ is low ($AlCl_3$: 1 Torr at 100° C.; $AlBr_3$: 5 Torr at 100° C.) so that it attaches to the side walls of the polycrystalline Si layer 14. The attached Al halide films 18a and 18b function as a side wall protective layer. If the quantity of the side wall protective layers is proper, the polycrystalline Si layer 14 is etched in a taper shape becoming thicker toward the lower portion. The attached aluminum trichloride film is removed by heating treatment at about 180° C. or by liquid mixture of $H_2SO_4$ and $H_2O_2$. In the heat treatment, the heated temperature must be lower than 300° C. to prevent generation of etching residue (so-called "rabbit ears") on the photo resist layer.

FIG. 3A to 3C illustrate shape-dependance of a resulting polycrystalline Si layer profile with the amount of Al introduced. In FIG. 3A–3C, like elements to those shown in FIG. 1A–1D are represented by using identical reference numerals. A substrate 10 was made of Si, an insulating film 12 was made of $SiO_2$, and a polycrystalline Si layer 14 had a thickness $t$ of 350 nm.

An example indicated in FIG. 3A shows the shape of the etched polycrystalline Si layer 14 without introducing Al. In this case, there is a side etch. In the present specification, polycrystalline silicon is considered to be "side-etched" if the resulting profile of the polycrystalline silicon under the mask is encroached from a mask edge at least at a peripheral location at the interface between the mask and polycrystalline silicon when the etching is completed. An example indicated in FIG. 3B shows vertically etched side walls of the polycrystalline Si layer 14 when introducing a certain amount of Al. An example indicated in FIG. 3C shows the polycrystalline Si layer 14 etched in a normal taper shape becoming thicker toward the lower portion thereof when introducing an increased amount of Al.

EXAMPLE 1

As a manner to introduce Al into plasma, Al in the form of gas may be introduced into the plasma as illustrated in FIG. 2. Namely, an etching gas $G_E$ such as $Cl_2$ and HBr is supplied via a mass flow controller $MC_1$ to an etching reaction chamber 20 and a gas $G_A$ such as $AlCl_3$ and $AlBr_3$ is supplied via a mass flow controller $MC_2$ to the chamber 20. In this case, the vapor pressure of $AlCl_3$ or $AlBr_3$ is relatively low in the room temperature so that the gas supply system is heated to a certain temperature such as 180° C.

In the case illustrated in FIG. 2, the amount of Al introduced is controlled by changing the flow of $AlCl_3$ or $AlBr_3$ by the mass flow controller $MC_2$. In the case of introducing Al from an electrode, the exposed area of Al in plasma is controlled. For example, the exposed Al area is controlled when alumina is coated or stripped, or if alumina is not coated, the surface area of an Al electrode (electrode size) is controlled.

EXAMPLE 2

As another manner to introduce Al into plasma, $AlCl_3$ or $AlBr_3$ may be supplied by reacting the etching gas with Al constituting the inner wall of an etching reaction chamber or an electrode. For example, in a plasma etcher using an etching gas containing halogen species such as Cl and Br which can react with Al, it is common to use an Al electrode having a protective layer of alumina obtained through anodic oxidation or alumite coating. If plasma etching is performed by stripping part or the whole of alumina on the surface of the Al electrode (or without forming any alumina protection layer), aluminum included in the exposed Al electrode reacts with halogen species in the plasma during the etching process so that $AlCl_3$ or $AlBr_3$ is generated and can be introduced into the plasma. The amount of Al introduced can be controlled by changing the exposed Al area.

Figure 4:
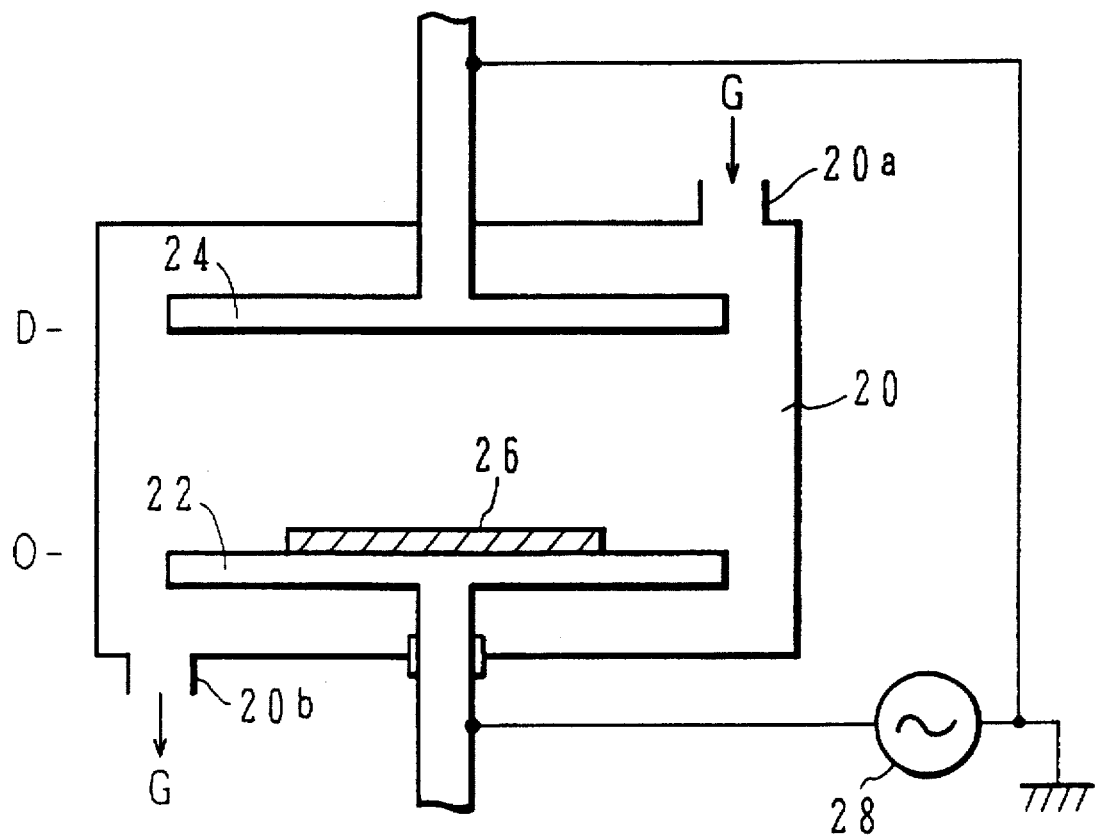
FIG. 4 is a cross sectional view of a parallel plate type plasma etcher.

FIG. 4 is a schematic diagram showing a parallel plate type plasma etcher (reactive ion etching apparatus) to be used in an embodiment of the invention.

The top of an etching reaction chamber 20 is provided with a gas inlet 20a for introducing a gas G, and the bottom of the chamber 20 is provided with a gas outlet 20b for exhausting the gas G. In the reaction chamber 20, upper and lower electrodes 22 and 24 are disposed in parallel. A wafer 26 to be processed is placed on the lower electrode 22. The lower electrode 22 is grounded via a high frequency power source 28, and the upper electrode 24 is directly grounded.

In the plasma etcher having the above-described structure, the amount of Al introduced can be controlled by changing the area of the exposed Al surface of the upper electrode 24 which is less susceptible to ion impacts, or by changing the exposed Al area at the region from O to D of the inner side walls of the reaction chamber 20.

Figure 5:
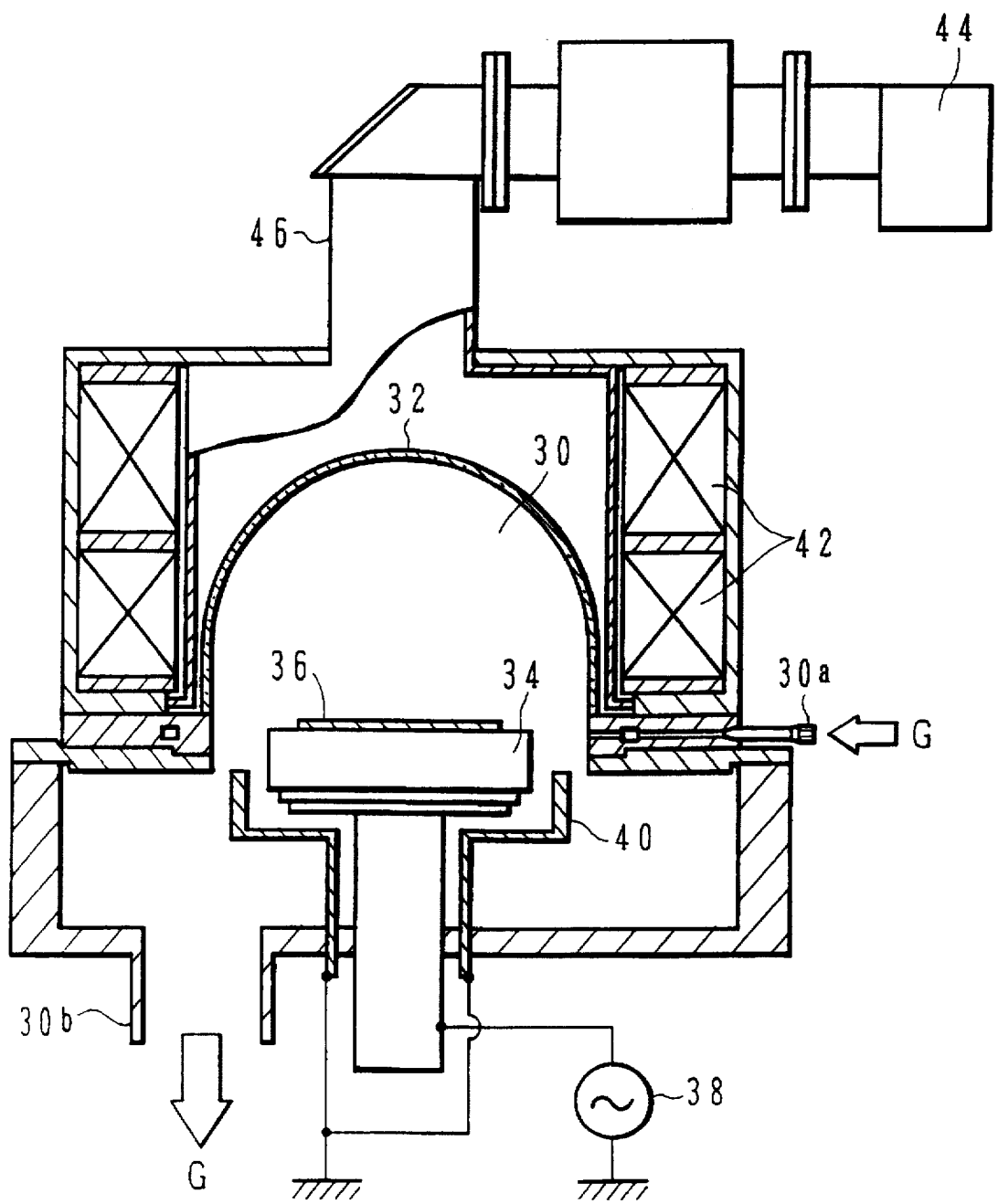
FIG. 5 is a cross sectional view of a microwave plasma etcher.

FIG. 5 is a schematic diagram showing a microwave plasma etcher to be used by the embodiment of the invention.

An etching reaction chamber 30 is made of a quartz bell jar 32 or the like. A gas inlet 30a for introducing a gas G is provided at the bottom of the bell jar, and a gas outlet 30b for exhausting the gas G is provided at the bottom of the chamber 30. Mounted in the reaction chamber 30 are a specimen support 34 for holding a wafer 36 to be processed and a ground electrode 40 surrounding the specimen support 34. A high frequency power source 38 is connected between the specimen support 34 and the ground, and the ground electrode is connected to the ground potential.

A solenoid coil 42 is provided for applying a magnetic field to the reaction chamber 30. A microwave power is supplied to the reaction chamber 30 from a microwave oscillator 44 such as a magnetron via a waveguide 46. The introduced gas G is ionized to generate plasma by the interaction between the magnetic field and microwave electric field.

In the plasma etcher having the above-described structure, the amount of Al introduced can be controlled by changing the exposed Al area of the ground electrode 40.

Examples of the shapes of polycrystalline Si layers selectively etched by the plasma etcher shown in FIG. 5 will be described. For the etching conditions, the flow of $Cl_2$ was set to 50 sccm, the etching pressure was set to 5 mTorr, the microwave power was set to 350 W, the high frequency power (2 MHz) was set to 30 W, and the electrode temperature was set to 20° C.

(1) In the case that the ground electrode 40 was fully coated with alumina, the resulting profile was as shown in FIG. 3A, showing a side etch of a polycrystalline Si layer 14.

(2) In the case that alumina was fully stripped from the ground electrode 40, the resulting profile was as shown in FIG. 3C, having a tapered shape.

(3) In the case that alumina was partially stripped from the ground electrode 40, the resulting profile was as shown in FIG. 3B, providing vertically etched side walls.

A relation between an amount of metal halide introduced into plasma and the resulting etching profile, is investigated with a plasma etcher illustrated in FIG. 5.

Experimental Condition

Figure 6A:
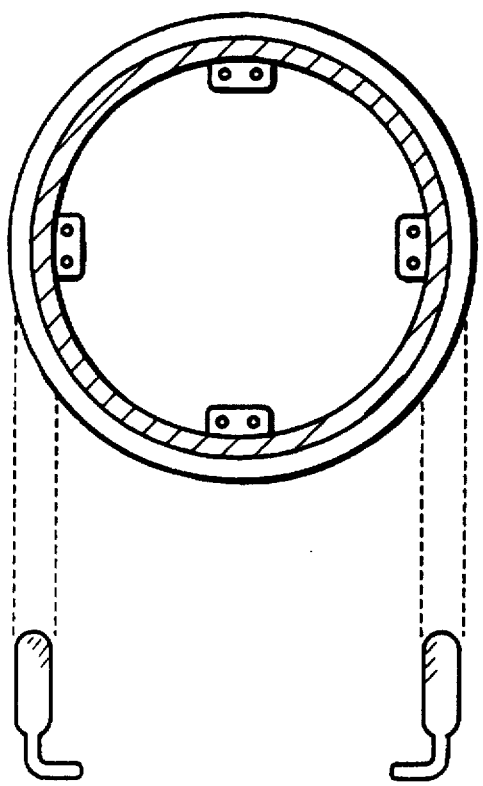
FIG. 6A and 6B are schematic views of a ground electrode.
Figure 6B:
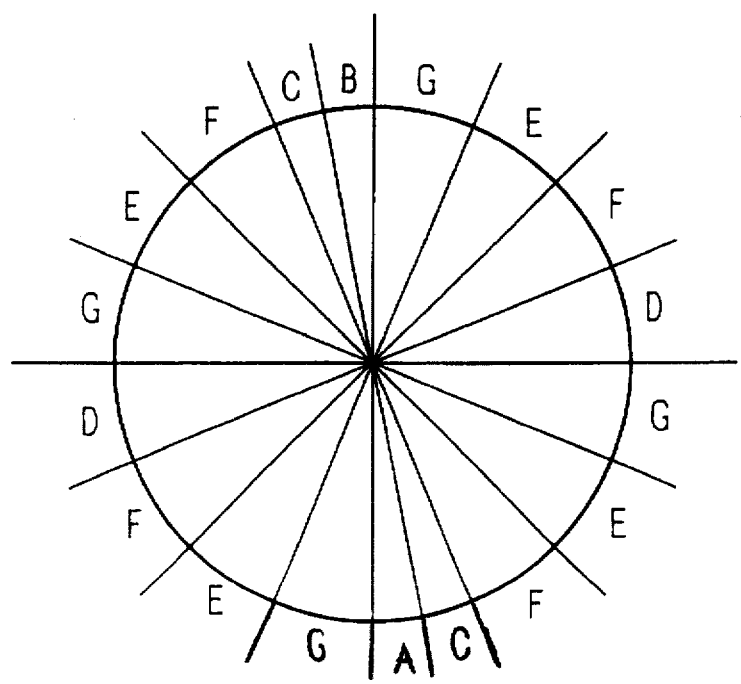

To change the amount of metal halide introduced into plasma, the area of uncovered aluminum on the ground electrode 40 is varied by stripping alumina (anodized aluminum) coating from the surface of the ground electrode 40. FIG. 6A illustrates a top view of the ground electrode 40. Alumina coating attached on a top surface of inner wall of the ground electrode 40 illustrated as a hatched area in FIG. 6A is sequentially stripped. FIG. 6B illustrates a schematic diagram of an order of stripping alumina coating from the ground electrode 40. Areas of alumina film are sequentially stripped from the ground electrode 40 in the order of area A to G. Same labelled area are simultaneously stripped away. Table I presented below illustrates percentages of areas of aluminum uncovered on the ground electrode 40 of the microwave plasma etcher.

TABLE I

| Area | Total uncovered area of Al (%) |
|---|---|
| A | 3.125 |
| B | 6.250 |
| C | 12.50 |
| D | 25.00 |
| E | 50.00 |
| F | 75.00 |
| G | 100.00 |

FIG. 7A shows plots of luminous intensities which are observed during etching polycrystalline silicon by $Cl_2$-He gas mixture at radiation bands of 265 nm and 394.4 nm due to aluminum monochloride (AlCl). The condition of etching is as follows.

| Parameters | Value |
|---|---|
| $Cl_2$ (sccm) | 50 |
| He* (sccm) | 5 |
| Total Pressure (mTorr) | 5 |
| RF Power (W) | 30 |
| Anode current of magnetron (mA) | 200 |

*He is used for cooling the substrate.

These plots are obtained by normalizing AlCl luminous intensities of 265 nm and 394.4 nm by luminous intensities of helium observed at radiation bands of 363 nm. Plots indicated as open circles are normalized luminous intensities observed at 265 nm. Plots indicated as solid circles are normalized luminous intensities observed at 394.4 nm. The intensities of aluminum monochloride increase as the uncovered aluminum area increases. In other words, increasing an uncovered aluminum area raises an area to be exposed to plasma. Accordingly, an amount of introduced aluminum into plasma also increases. Introduced aluminum reacts with chloride species in plasma, therefore, amount of aluminum halide such as aluminum trichloride ($AlCl_3$) to be attached to the side walls of polycrystalline silicon is considered to be increased in plasma.

Figure 7B:
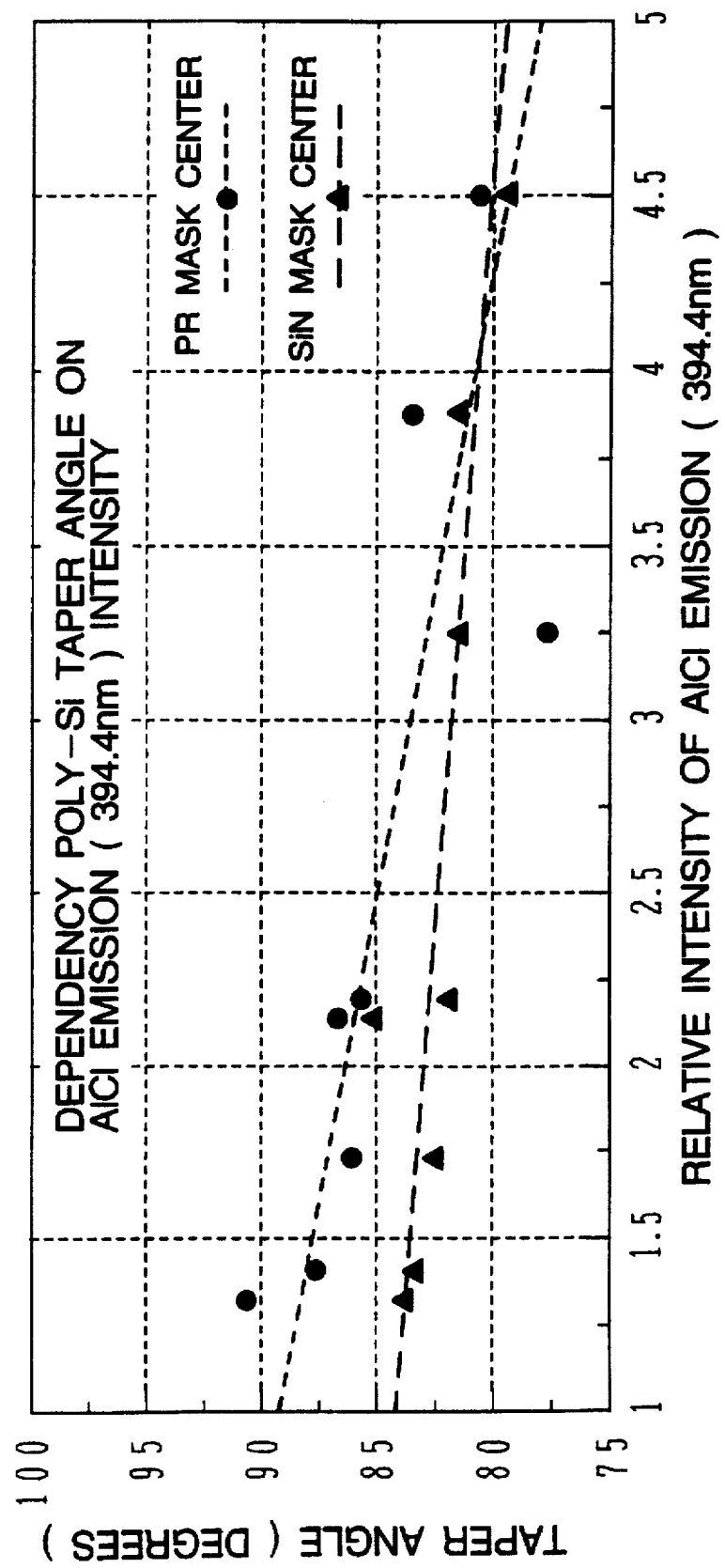

FIG. 7B shows plots showing dependency of angles of side wall slope ("taper angle") of resulting etched polycrystalline silicon profiles with respect to luminous intensities of aluminum monochloride observed at 394.4 nm, in which intensities are normalized by luminous intensities of helium observed at 363 nm. The taper angle is defined as an angle formed between a side wall of polycrystalline silicon and an interface between "polycrystalline silicon" and "thin oxide film". The condition of etching is identical as above. Photo resist and silicon nitride are used as mask materials for etching. Plots indicated as solid circles and solid triangles illustrate trends of taper angles of resulting etched polycrystalline silicon profiles using a photo resist mask and a silicon nitride mask, respectively. As seen from the plots, the taper angles decrease as the luminous intensity increases.

Figure 7C:
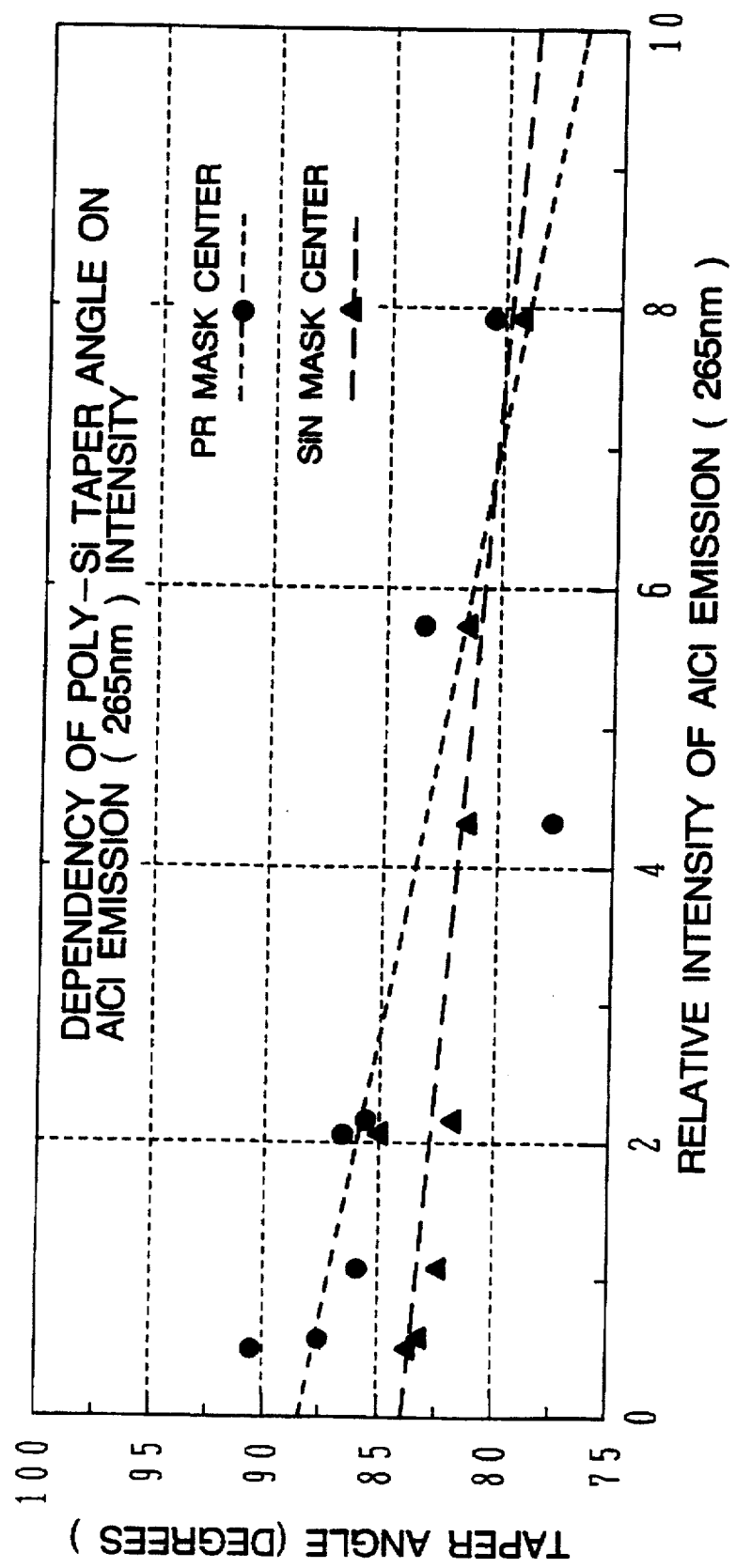

FIG. 7C shows plots showing dependency of taper angles of resulting etched polycrystalline profiles with respect to luminous intensities of aluminum monochloride observed at 285 nm. The luminous intensity is normalized by the luminous intensity of helium observed at 363 nm. The condition of etching and mask materials are identical as above. Plots indicated as solid circles and solid triangles illustrate trends of taper angles of resulting etched polycrystalline silicon profiles using a photo resist mask and a silicon nitride mask, respectively. The taper angles decrease as the luminous intensity increases as described above.

Figure 7D:
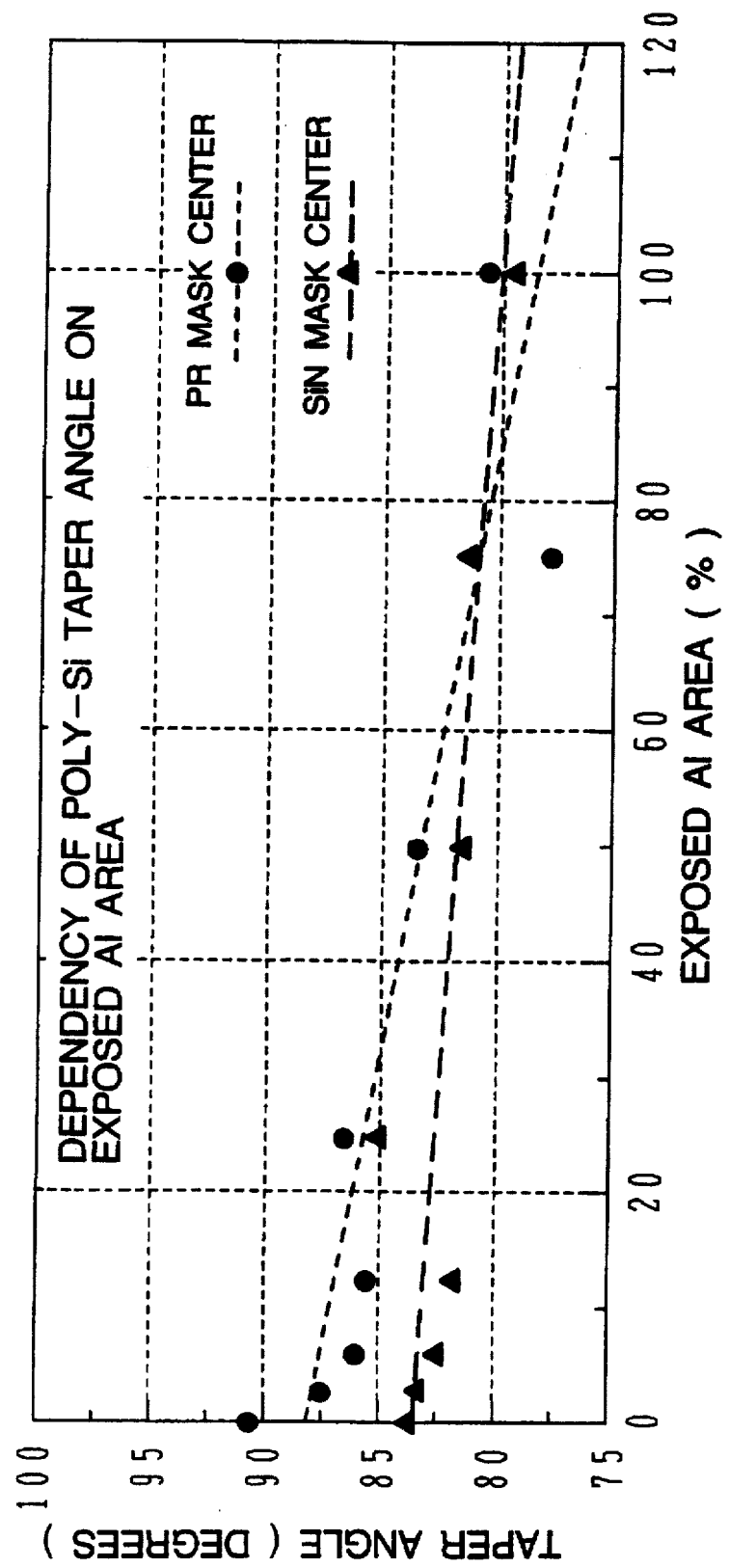

FIG. 7D shows plots showing dependency of taper angles of resulting etched polycrystalline profiles with respect to an uncovered aluminum area percentage. The condition of etching and mask materials are identical as above. Plots indicated as solid circles and solid triangles illustrate trends of taper angles of resulting etched polycrystalline silicon profiles using a photo resist mask and a silicon nitride mask, respectively. The taper angles decrease as the luminous intensity increases as described above.

The reason for these trends are estimated as follows. As the luminous intensity becomes higher, aluminum halide in plasma increases as indicated in FIG. 7A. As aluminum halide has a low vaporization pressure, aluminum halide tends to deposit at room temperature. As a result, an amount of deposition on a side wall of polycrystalline silicon increases as the luminous intensity of aluminum monochloride becomes more intense. Such increase of deposition accelerates protection of side walls of polycrystalline silicon. Therefore, the taper angle decreases.

It can be understood from the above experiment results that the etched shape can be controlled by changing the exposed Al area of the electrode.

In the above preferred embodiment, aluminum trichloride ($AlCl_3$) is used as metal halide attaching to side walls of polycrystalline silicon layer. Nevertheless, metal halide is not limited to $AlCl_3$ but may also be aluminum tribromide ($AlBr_3$), tantalum pentachloride ($TaCl_5$), niobium pentachloride ($NbCl_5$), titanium tetrachloride ($TiCl_4$), molybdenum pentachloride ($MoCl_5$) and tungsten hexachloride ($WCl_6$). Mixtures of metal halides may also be used.

Although the invention has been described with a limited number of embodiments, it is not limited thereto. It will be apparent for those skilled in the art that various alterations, modifications and combinations are possible within the spirit and scope of the invention.

I claim:

1. A dry etching method for selectively etching a silicon-based material layer having an etchant mask over a portion thereof by a plasma etching process using an etchant gas containing Cl or Br, wherein:

said plasma etching process etches said silicon-based material layer by supplying Al or Al halide to the plasma so that Al halide is attached to etched side walls of said silicon-based material layer and so as to taper-etch said silicon-based material layer, wherein taper etching means that the profile after etching is such that no peripheral location encroaches under a mask edge at the interface between the mask and the silicon-based material layer.

2. A dry etching method according to claim 1, wherein Al is supplied to the plasma.

3. A dry etching method according to claim 1, wherein Al is supplied by exposing an Al surface at an area of the silicon-based material layer contacting the plasma.

4. A dry etching method according to claim 1, wherein a gas of Al halide is supplied to the plasma.

5. A dry etching method according to claim 4, wherein said Al halide is at least one species selected from the group consisting of $AlCl_3$ and $AlBr_3$.

6. A method of manufacturing a semiconductor device comprising the steps of:

(a) providing a semiconductor substrate having a horizontal plane;

(b) providing a wiring layer comprising polycrystalline silicon on the horizontal plane and an etchant mask over a portion of the wiring layer; and (c) taper etching the wiring layer in Cl or Br containing plasma of an ambient atmosphere including an aluminum halide species to form a wiring to serve as an electrical connection on the semiconductor device, the wiring having side walls, and simultaneously depositing solid aluminum halide film formed from the aluminum halide species in the plasma on the side walls to protect the side walls from side-etching, wherein taper etching means that the profile of the resulting etched wiring layer is such that no peripheral location under the mask has encroachment from a mask edge at the interface between the mask and the wiring layer.

7. A method of manufacturing a semiconductor device according to claim 6, further comprising the steps of:

(d) forming a mask layer on the wiring layer; and (e) patterning the mask layer.

8. A method of manufacturing a semiconductor device according to claim 7, wherein the mask layer is a photo resist layer.

9. A method of manufacturing a semiconductor device according to claim 7, wherein the wiring layer is subjected to the ambient atmosphere over the patterned mask layer in the etching step.

10. A method of manufacturing a semiconductor device according to claim 6, further comprising the steps of:

(f) providing a vacuum apparatus; and (g) introducing vaporized aluminum halide into the vacuum apparatus to constitute a composition of the ambient atmosphere.

11. A method of manufacturing a semiconductor device according to claim 10, wherein the aluminum halide comprises aluminum chloride or aluminum bromide.

12. A method of manufacturing a semiconductor device according to claim 6, further comprising the steps of:

(h) providing a vacuum apparatus;

(i) providing an aluminum electrode in the vacuum apparatus;

(j) forming a plasma in the vacuum apparatus, which plasma serves as the ambient atmosphere;

(k) subjecting the aluminum electrode to the plasma to form aluminum halide in the plasma; and (l) depositing solid aluminum halide on the side walls of the wiring to protect the wiring from side-etching.

13. A method of manufacturing a semiconductor device comprising the steps of:

(a) providing a vacuum apparatus;

(b) providing a specific metal element in the vacuum apparatus;

(c) providing a semiconductor substrate having a wiring layer thereon in the vacuum apparatus;

(d) forming a plasma including halogen species in the vacuum apparatus;

(e) subjecting the specific metal element to the plasma to generate specific metal halide in the plasma, the specific metal halide keeping solid phase at a room temperature;

(f) simultaneously subjecting the wiring layer to the plasma to form wiring to serve as an electrical connection on the semiconductor device, the wiring having side walls with a solid phase specific metal halide thereon to protect the wiring from side-etching.

14. A method of manufacturing a semiconductor device according to claim 13, wherein the specific metal element is aluminum.

15. A method of manufacturing a semiconductor device according to claim 13, wherein halogen species comprises chloride or bromide.

16. A method of manufacturing a semiconductor device according to claim 13, wherein specific metal halide comprises aluminum trichloride or aluminum tribromide.

17. A dry etching method for etching a silicon based material layer over a mask pattern, comprising the steps of:

placing a mask pattern over a silicon-based material; and etching the silicon based material layer using an etching gas containing a compound comprising one element selected from the group consisting of chlorine and bromine and an additive of aluminum introduced into the etching gas so as to taper-etch said silicon-based material, wherein taper etching means that the profile after etching is such that no peripheral location encroaches under a mask edge at the interface between the mask and the silicon-based material.

18. A dry etching method according to claim 17, wherein the taper-etched silicon-based material layer is heated to a temperature of about 180° to less than 300° C.

19. A dry etching method according to claim 1, wherein the taper-etched silicon-based material layer is heated to a temperature of about 180° to less than 300° C.

20. A dry etching method according to claim 18, wherein the taper-etched silicon-based material layer is heated to a temperature of about 180° to less than 300° C.

* * * * *